United States Patent
Lee

(10) Patent No.: US 8,803,324 B2
(45) Date of Patent: Aug. 12, 2014

(54) SEMICONDUCTOR DEVICES AND METHODS OF MANUFACTURING THE SAME

(75) Inventor: Young Jin Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/602,101

(22) Filed: Sep. 1, 2012

(65) Prior Publication Data

US 2013/0113111 A1    May 9, 2013

(30) Foreign Application Priority Data

Nov. 9, 2011    (KR) .................. 10-2011-0116192

(51) Int. Cl.
*H01L 21/48*    (2006.01)

(52) U.S. Cl.
USPC ........... 257/774; 257/664; 257/665; 257/786; 257/E23.011; 257/E21.577

(58) Field of Classification Search
USPC ................................ 257/664–665, 734–786, 257/E29.111–E29.165, E23.01–E23.079, 257/E23.141–E23.179
See application file for complete search history.

(56) References Cited

U.S. PATENT DOCUMENTS

| | | | | |
|---|---|---|---|---|
| 2002/0096778 | A1* | 7/2002 | Cox | 257/774 |
| 2005/0224854 | A1* | 10/2005 | Park | 257/296 |
| 2012/0276711 | A1* | 11/2012 | Yoon et al. | 438/421 |

FOREIGN PATENT DOCUMENTS

| | | | |
|---|---|---|---|
| KR | 1020010063853 | A | 7/2001 |
| KR | 1020060000299 | A | 1/2006 |
| KR | 1020080061168 | A | 7/2008 |
| KR | 1020080081577 | A | 9/2008 |
| KR | 1020080085540 | A | 9/2008 |
| KR | 1020090105601 | A | 10/2009 |

* cited by examiner

*Primary Examiner* — Mamadou Diallo
(74) *Attorney, Agent, or Firm* — William Park & Associates Patent Ltd.

(57) ABSTRACT

A semiconductor device and methods directed toward preventing a leakage current between a contact plug and a line adjacent to the contact plug, and minimizing capacitance between adjacent lines.

9 Claims, 13 Drawing Sheets

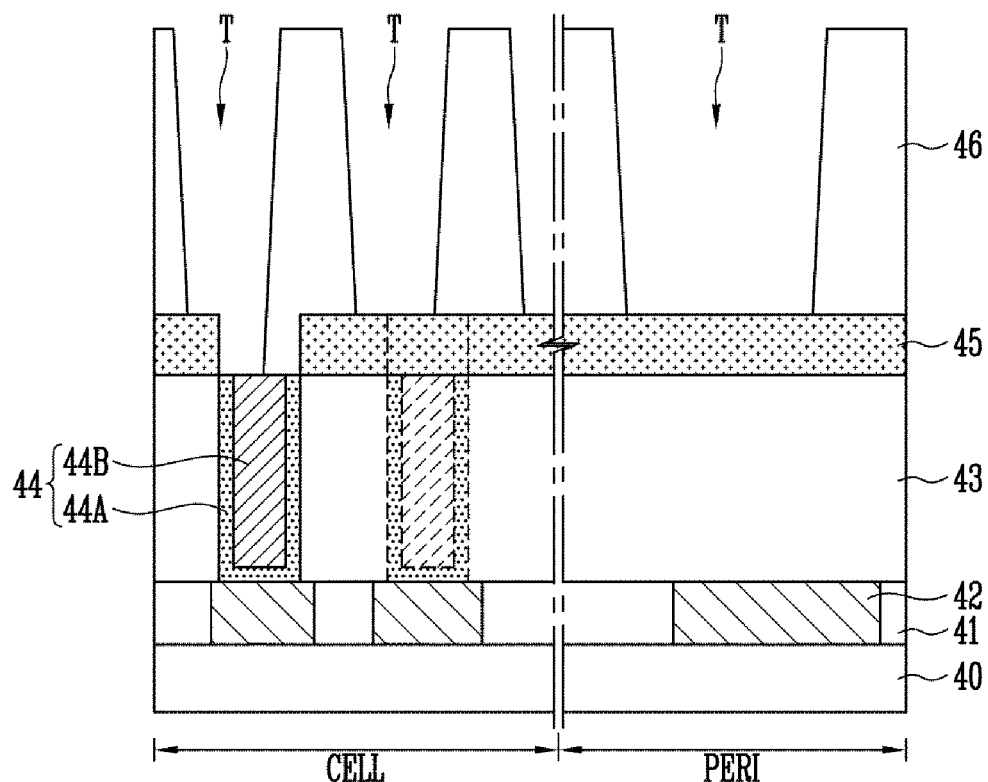
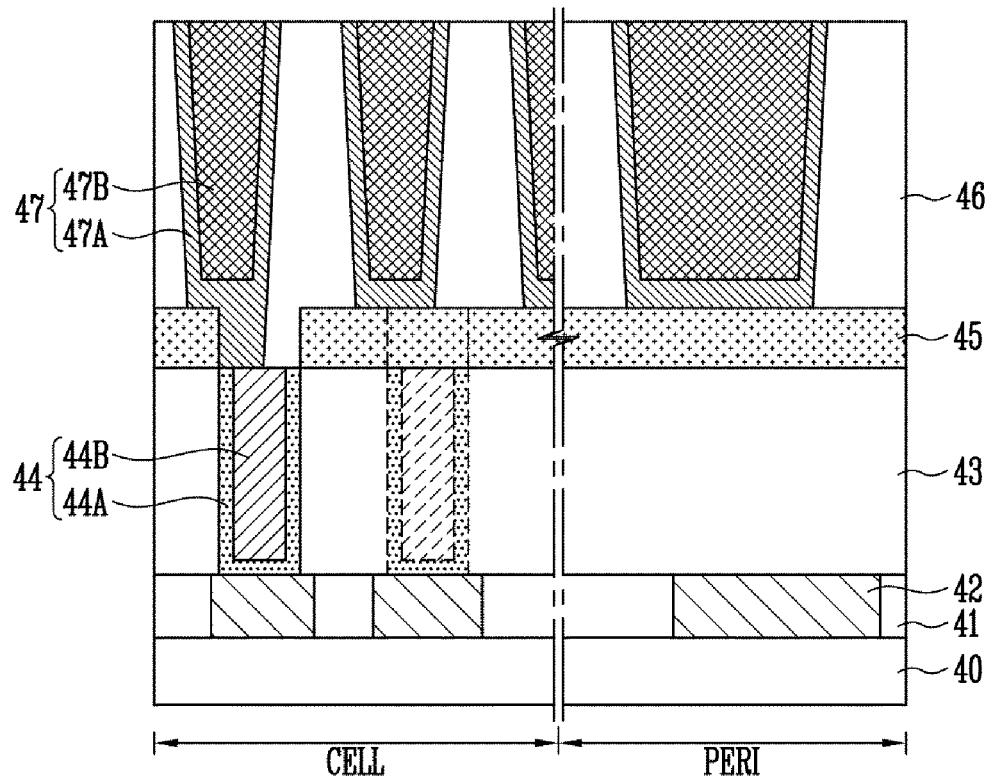

SEMICONDUCTOR DEVICES AND METHODS OF MANUFACTURING THE SAME

CROSS-REFERENCE TO RELATED APPLICATION

Priority is claimed to Korean patent application number 10-2011-0116192, filed on Nov. 9, 2011, the entire disclosure of which is incorporated by reference herein.

BACKGROUND

The present invention relates generally to semiconductor devices and methods of manufacturing the same, and in particular to semiconductor devices including contact plugs and lines and methods of manufacturing the same.

An overlay margin between a metal line and a contact plug becomes smaller as cell area decreases. This decrease in cell area is directly attributable to the increase in the degree of integration of memory devices. As the overlay margin becomes smaller, there is a high probability that metal lines and contact plugs may be misaligned because the metal lines are formed after forming the contact plugs.

If metal lines and contact plugs are misaligned as described above, the distance between a contact plug and a metal line adjacent to the contact plug decreases. The distance between the contact plug and the adjacent metal line may become smaller than the critical distance at which leakage current does not occur between adjacent conductive layers. As a result, a leakage current may be generated between the contact plug and the adjacent metal line.

Furthermore, unwanted capacitance between metal lines increases as the distance between adjacent metal lines decreases.

SUMMARY

A semiconductor device suitable for preventing a leakage current from occurring between a contact plug and a line adjacent to the contact plug, and a method of manufacturing the same, are discussed below in accordance with an embodiment of the present invention.

In an embodiment, a semiconductor device includes a first interlayer insulating layer, an etch stop layer formed on the first interlayer insulating layer, contact holes formed to penetrate the etch stop layer and the first interlayer insulating layer, contact plugs formed within the respective contact holes and configured to have a top surface lower than a top surface of the etch stop layer, a second interlayer insulating layer formed over the contact plugs and the etch stop layer, line trenches formed to penetrate the second interlayer insulating layer, wherein the respective contact plugs are exposed in the line trenches, and lines formed within the trenches and coupled to the respective contact plugs.

In accordance with another embodiment, a method of manufacturing a semiconductor device includes forming contact plugs, each having a top surface having a lower height than a top surface of an etch stop layer, within respective contact holes formed to penetrate a first interlayer insulating layer and the etch stop layer formed on the first interlayer insulating layer; forming a second interlayer insulating layer on the results in which the contact plugs are formed; forming line trenches through which the respective contact plugs are exposed by etching the second interlayer insulating layer; and forming lines, coupled to the contact plugs, within the respective line trenches.

BRIEF DESCRIPTION OF THE DRAWINGS

Features, aspects, and embodiments are described in conjunction with the attached drawings, in which:

FIGS. 3A to 3E are cross-sectional views illustrating contact plugs and lines formed according to a third embodiment of the invention;

DETAILED DESCRIPTION

Embodiments of the present invention are described below in more detail with reference to the accompanying drawings. The present invention may, however, be embodied in different forms and should not be construed as limited to the embodiments set forth herein.

Figure 1A:
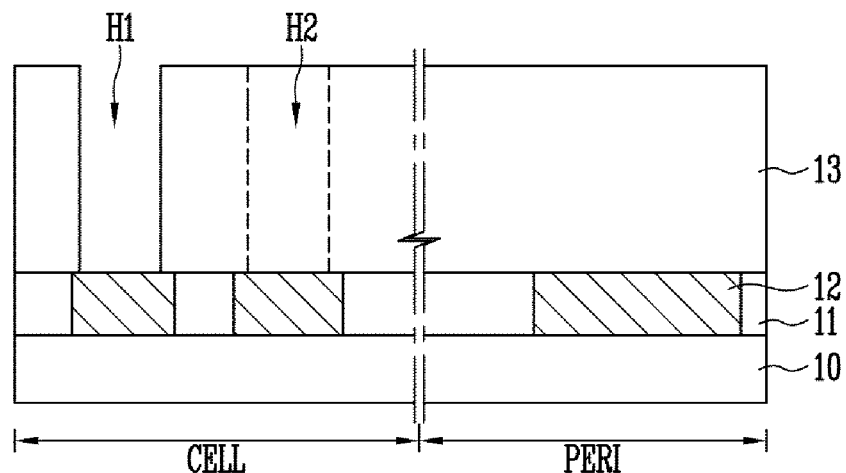
FIGS. 1A to 1E are cross-sectional views illustrating contact plugs and lines formed according to a first embodiment of the invention.

As shown in FIG. 1A, a first interlayer insulating layer 13 is formed over a substrate 10 upon which underlying structures 12 are formed. The underlying structures 12 may include, for example, lower lines and contact plugs that are formed within an interlayer insulating layer 11.

A plurality of contact holes (for example, H1 and H2) is formed in a cell region by etching the first interlayer insulating layer 13. For example, if contact plugs for bit lines are formed, the plurality of contact holes H1 and H2 is arranged on the cross. The second contact holes H2 disposed on the rear side of the sections shown in FIG. 1 are indicated by a dotted line in order to indicate that the first contact hole H1 and the second contact hole H2 are arranged on the cross.

Figure 1B:
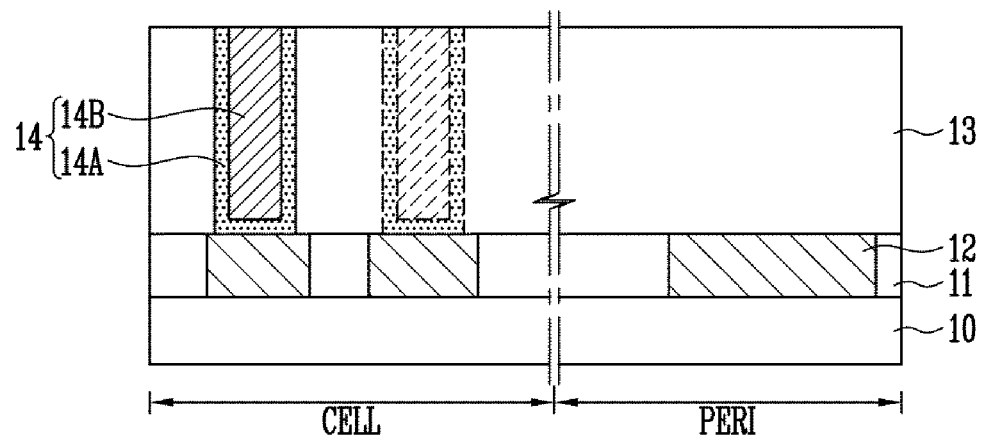

As shown in FIG. 1B, a plurality of contact plugs 14 is formed in the cell region by filling the respective contact holes H1 and H2 with a conductive layer. Each of the contact plugs 14 may include a barrier layer 14A formed on the inner surface of the contact hole and a metal layer 14B formed on the barrier layer 14A.

Figure 1C:
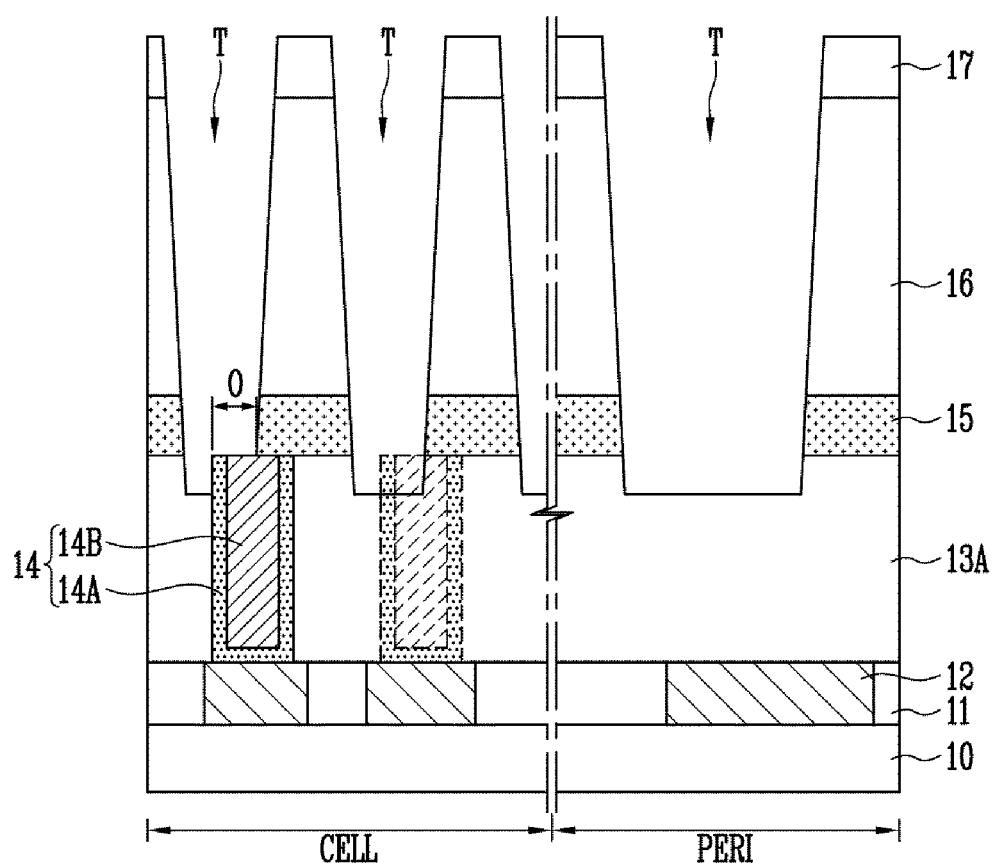

As shown in FIG. 1C, an etch stop layer 15 is formed on the first interlayer insulating layer (13 in FIG. 1B) in which the plurality of contact plugs 14 is formed. A second interlayer insulating layer 16 is formed on the etch stop layer 15.

A mask pattern 17 for lines is formed on the second interlayer insulating layer 16. The mask pattern 17 for lines has openings through which positions where the lines will be formed are exposed. For example, in the cell region, the openings are placed so that the contact plugs 14 are exposed.

A plurality of line trenches T is formed by etching the second interlayer insulating layer 16 and the etch stop layer 15 using the mask pattern 17 for lines as an etch barrier. Here, an over-etch process may be performed in order to prevent a not-open phenomenon in which the contact plugs 14 under some of the line trenches T are not exposed due to a difference in the etch depth between the line trenches T. In this process, the first interlayer insulating layer 13 may be partially etched deep. In FIG. 1C, the etched first interlayer insulating layer is denoted by 13A. Due to limitations in the lithography process, the mask pattern 17 may not be placed precisely in the desired position, so the mask pattern 17 may be misaligned by a specific distance O.

Figure 1D:
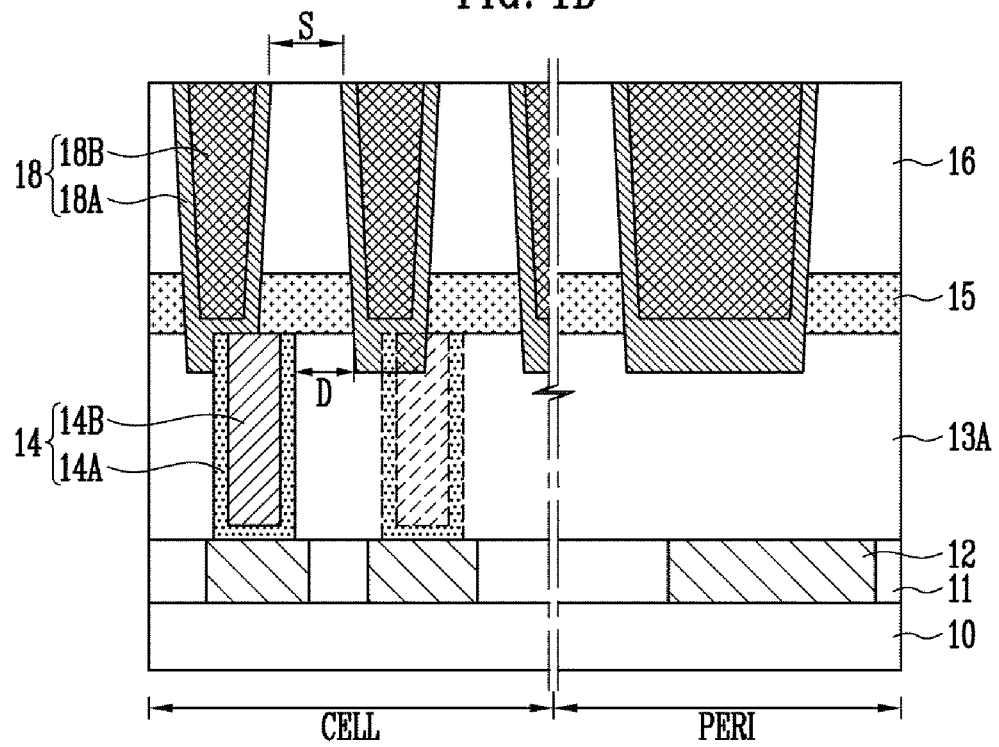

As shown in FIG. 1D, a plurality of lines 18 is formed in the respective line trenches T by filling the trenches T with a conductive layer. Each of the lines 18 is formed to come in contact with a top surface of the contact plug 14 and with an upper sidewall of the contact plug 14 that is exposed in the over-etch process.

The line 18 may include a barrier layer 18A formed on the inner surface of the line trench T and a metal layer 18B formed on the barrier layer 18A. Furthermore, the lines 18 adjacent to each other are spaced apart from each other by a specific distance S in order to prevent a leakage current. For example, the lines 18 adjacent to each other may be spaced apart from each other at a critical distance k that does not generate a leakage current.

As a result, the contact plugs and the lines are formed. Here, an insulating layer, such as an oxide layer, is formed between adjacent lines.

Air gaps may be formed by removing the insulating layer formed between adjacent lines. A process for forming the air gaps is described below with reference to FIG. 1E.

Figure 1E:
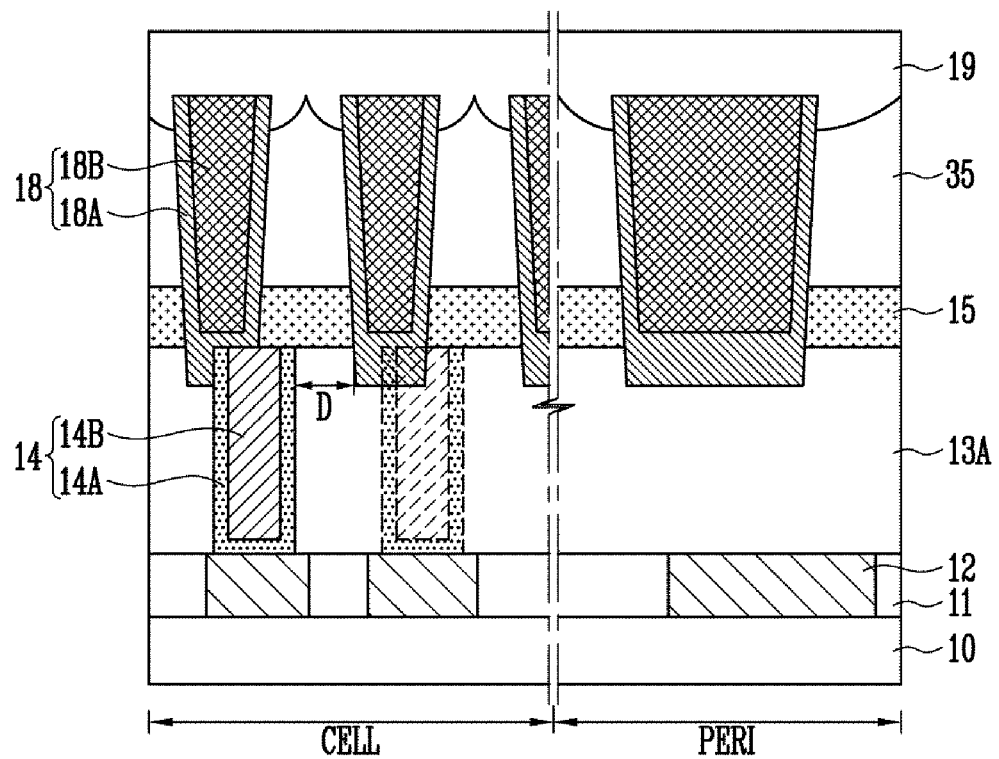

As shown in FIG. 1E, after forming the contact plugs and the lines, a process of removing the second interlayer insulating layer 16, formed between the lines 18 adjacent to each other, may be performed. As a result, a gap region is formed between the adjacent lines 18.

An insulating layer 19 is formed to cover the tops of the gap regions. Thus, an empty space, that is, an air gap 35, is formed between the adjacent lines 18.

The etched first interlayer insulating layer 13A under the second interlayer insulating layer 16 is protected by the etch stop layer 15. Thus, only the second interlayer insulating layer 16 can be selectively removed in such a way that the first interlayer insulating layer 13A remains intact. Accordingly, the air gaps 35 can be easily formed.

Figure 2A:
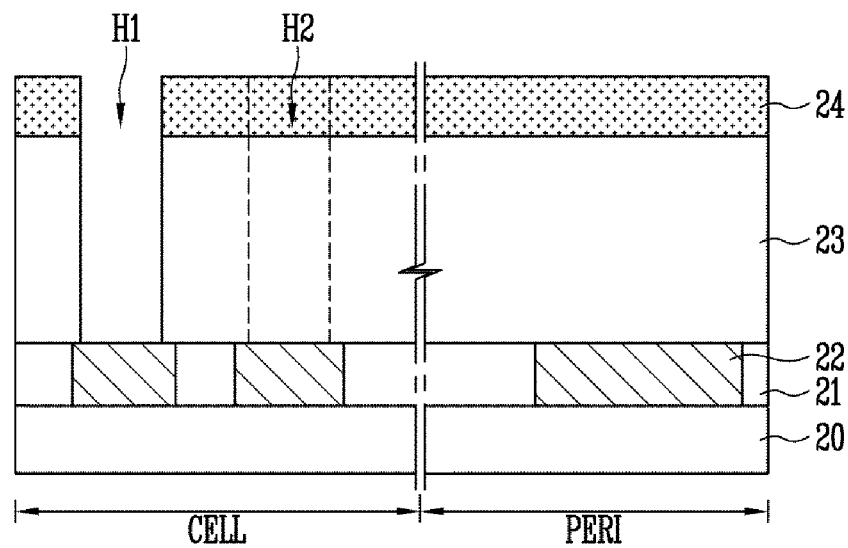
FIGS. 2A to 2F are cross-sectional views illustrating contact plugs and lines formed according to a second embodiment of the invention.

As shown in FIG. 2A, a first interlayer insulating layer 23 is formed over a substrate 20 upon which underlying structures 22 are formed. The underlying structures 22 may include, for example, lower lines and contact plugs which are formed within an interlayer insulating layer 21.

An etch stop layer 24 is formed on the first interlayer insulating layer 23. The etch stop layer 24 functions to prevent the first interlayer insulating layer 23 from being etched in a subsequent process for forming line trenches. It is preferred that the etch stop layer 24 be made of material having a high etch selectivity to a second interlayer insulating layer 28 to be formed in a subsequent process. The etch stop layer 24 may be formed of a nitride layer, for example.

A plurality of contact holes (for example, H1 and H2) is formed in a cell region by etching the etch stop layer 24 and the first interlayer insulating layer 23. If contact plugs for bit lines, for example, are formed, the plurality of contact holes H1 and H2 is arranged on the cross. The second contact holes H2 disposed on the rear side of the sections shown in FIG. 2 are indicated by a dotted line in order to indicate that the first contact hole H1 and the second contact hole H2 are arranged on the cross.

Figure 2B:
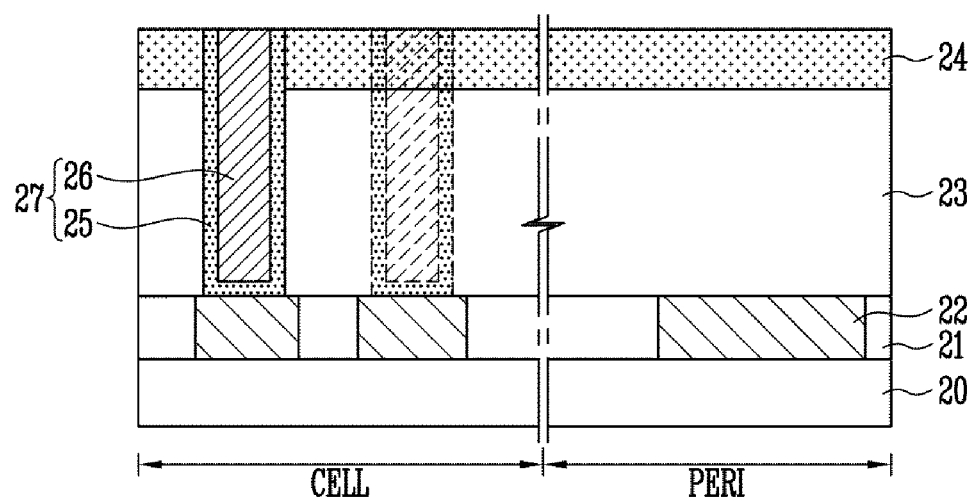

As shown in FIG. 2B, a plurality of contact plugs 27 is formed in the respective contact holes H1 and H2 by filling the contact holes H1 and H2 with a first conductive layer. For example, after forming the first conductive layer on the entire structure, including appropriate regions proximate contact holes H1 and H2, the contact plugs 27 may be formed by etching the first conductive layer until a surface of the etch stop layer 24 is etched. In this case, a top surface of the contact plugs 27 has the same height as a top surface of the etch stop layer 24.

The first conductive layer may be made of any one of polysilicon, titanium (Ti), cobalt (Co), nickel (Ni), tantalum (Ta), and tungsten (W), or a combination of them or a nitride compound thereof. Furthermore, the process of etching the first conductive layer may be a chemical mechanical polishing (CMP) process, an etch-back process, or a cleaning process.

Each of the contact plugs 27 may include a barrier layer 25 formed on the inner surface of the contact hole and a metal layer 26 formed on the barrier layer 25. For example, the contact plugs 27 may be formed by forming the barrier layer 25 on the entire structure, including the contact holes H1 and H2, forming the metal layer 26 on the barrier layer 25 so that the contact holes H1 and H2 are fully filled, and then etching the metal layer 26 and the barrier layer 25 until a surface of the etch stop layer 24 is exposed.

For example, the barrier layer 25 may be made of any one of Ti, TiN, Ta, TaN, and TiSiN or a combination of them, and the metal layer 26 may be made of copper (Cu) or tungsten (W).

Figure 2C:
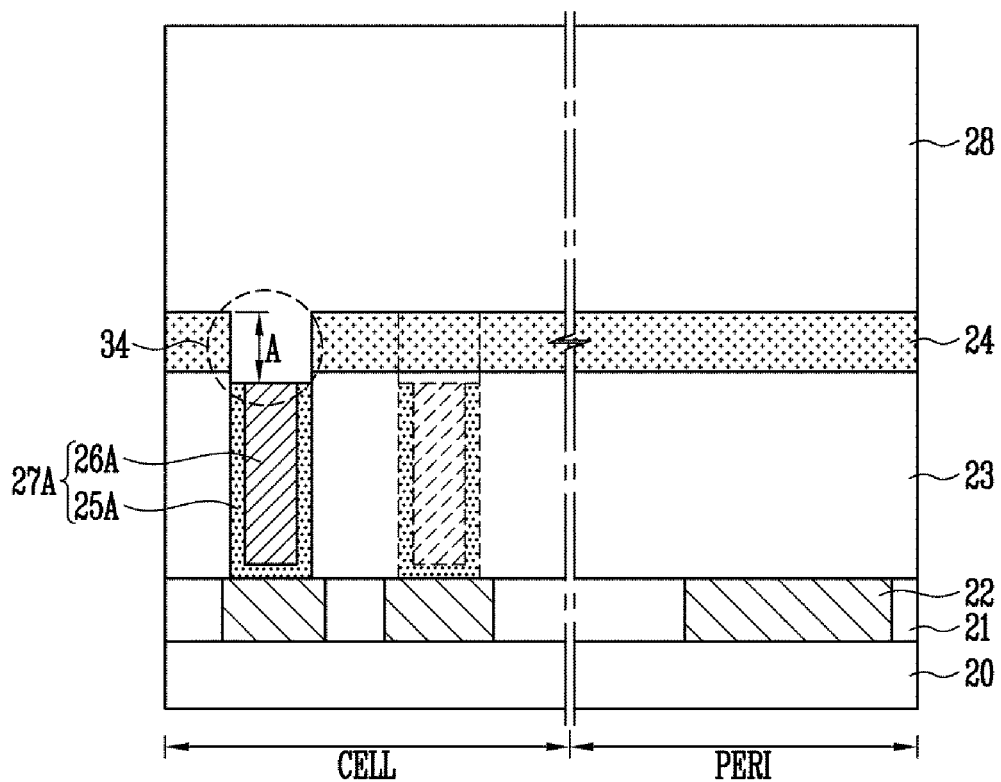

As shown in FIG. 2C, the contact plugs 27 are partially etched to a specific depth so that the top surface of the contact plugs 27 is lower than the top surface of the etch stop layer 24. In order to secure a sufficient distance between the contact plug 27 and a line formed in a subsequent process and configured to be adjacent to the contact plugs 27, the contact plugs 27 may be partially etched to a specific depth, so that the top surface of the contact plugs 27 is lower than the top surface of the first interlayer insulating layer 23. For example, only the contact plugs 27 may be selectively etched using an etch process and a cleaning process. In the figures, the etched barrier layer is denoted by 25A, the etched metal layer is denoted by 26A, and the etched contact plugs are denoted by 27A.

The etch process is performed in order to prevent a leakage current from occurring between the contact plug 27A and a metal line formed in a subsequent process and configured to be adjacent to the contact plugs 27A. If the height of the contact plugs 27A is lowered by partial etching as described above, a difference between the top surface of the contact plugs 27A and the top surface of the etch stop layer 24 becomes 'A'. Accordingly, a leakage current can be effectively prevented because the distance between the contact plugs 27A and the adjacent lines is increased.

Next, the second interlayer insulating layer 28 is formed following the process in which the contact plugs 27A have been partially etched as described above. It is preferred that the second interlayer insulating layer 28 be made of material having a high etch selectivity to the etch stop layer 24. For example, the etch stop layer 24 may be formed of a nitride layer, and the second interlayer insulating layer 28 may be formed of an oxide layer.

In the process of forming the second interlayer insulating layer 28, the second interlayer insulating layer 28 is also formed in the partially etched regions of the contact plugs 27A (34 in FIG. 2C). As a result, the second interlayer insulating layer 28 is formed within the contact holes H1 and H2 in which the respective contact plugs 27A are formed and on the etch stop layer 24.

Figure 2D:
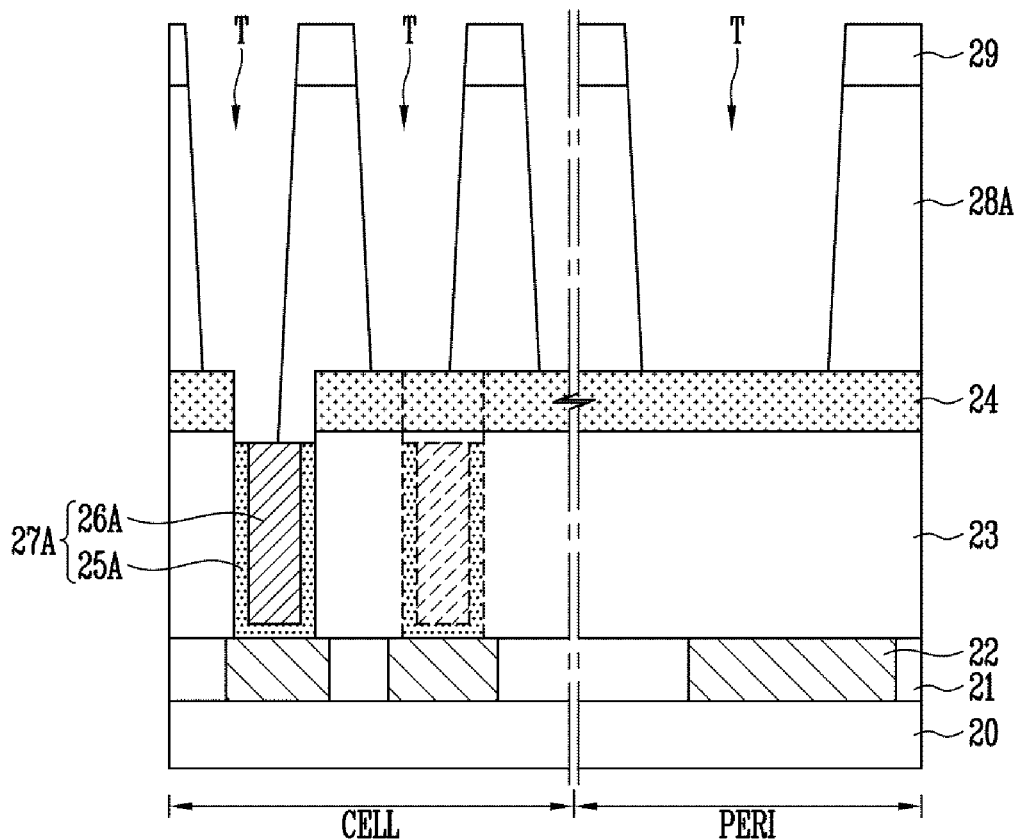

Referring to FIG. 2D, a mask pattern 29 for lines is formed on the second interlayer insulating layer 28. The mask pattern 29 for lines has openings through which positions where the lines will be formed are exposed. For example, in the cell region, the openings are placed so that the contact plugs 27A are exposed.

Line trenches T through which the contact plugs 27A are exposed are formed by etching the second interlayer insulating layer 28 using the mask pattern 29 for lines as an etch barrier. Here, the line trenches T may also be formed in a peripheral circuit region. In the figures, the etched second interlayer insulating layer is denoted by 28A.

In this case, due to limitations of the lithography process, the mask pattern 29 for lines may not be formed at precisely the desired position, and may thus be misaligned by a specific distance. For this reason, when forming the line trenches T, the second interlayer insulating layer 28 is etched relying upon the fact that the etch stop layer 24 and the second interlayer insulating layer 28 have a high etch selectivity. Accordingly, when etching the second interlayer insulating layer 28, the etch stop layer 24 remains intact without being etched, and thus the first interlayer insulating layer 23 under the etch stop layer 24 is protected without being damaged. In particular, in order to prevent the not-open phenomenon, the first interlayer insulating layer 23 under the etch stop layer 24 is protected without being etched while performing the over-etch process. Consequently, only the top surface of the contact plugs 27A is exposed at the bottoms of the line trenches T, but upper sidewalls of the contact plugs 27A are not exposed.

Furthermore, when forming the line trenches T, the second interlayer insulating layer 28 formed in the etched regions of the contact plugs 27A is etched. Thus, the line trenches T overlap with the contact holes H1 and H2 in the etched regions.

Figure 2E:
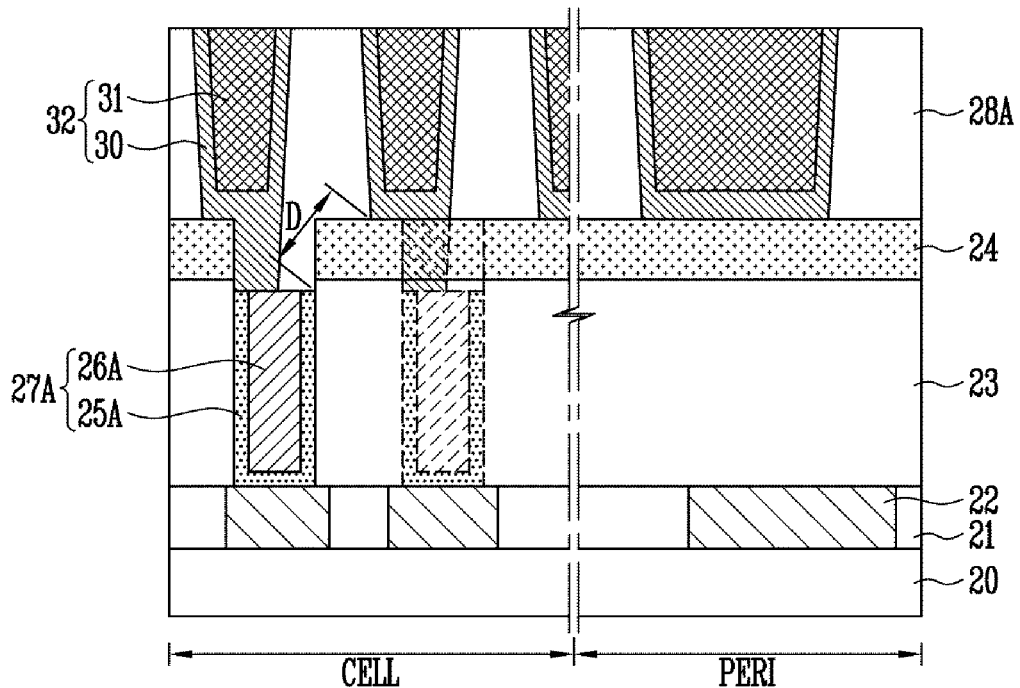
Figure 2F:
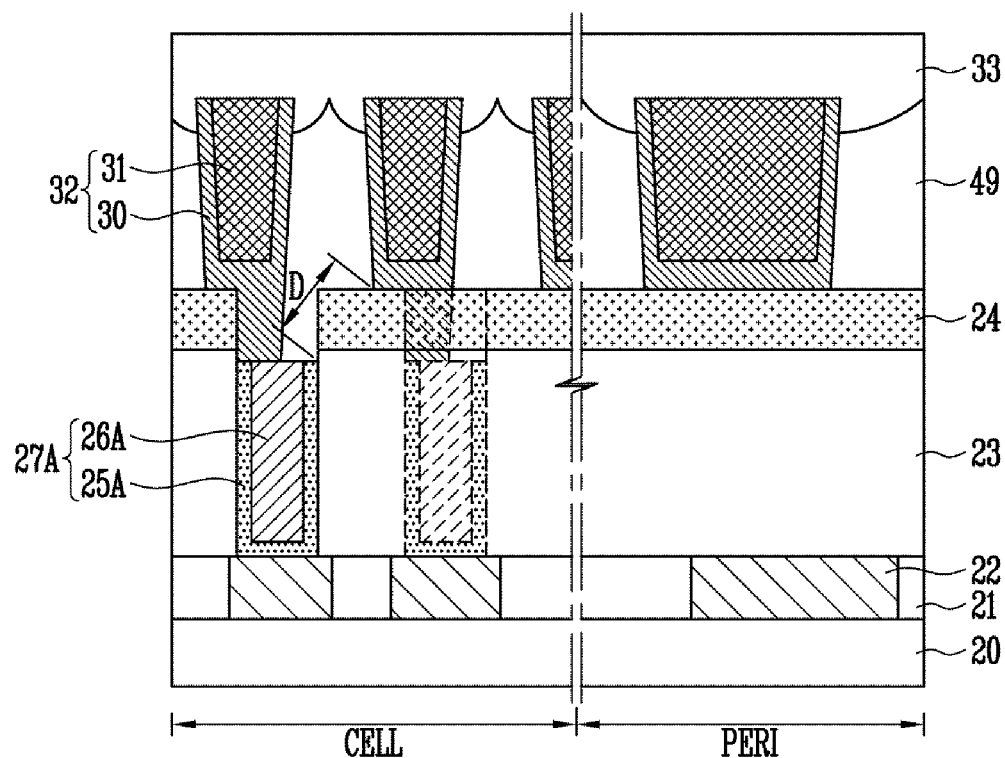

As shown in FIG. 2E, a second conductive layer is formed within the line trenches T, thereby forming lines 32 coupled to the respective contact plugs 27A. For example, the lines 32 may be formed by forming the second conductive layer on the entire structure after the process in which the line trenches T are formed, and then etching the second conductive layer until a surface of the second interlayer insulating layer 28A is exposed. The process of etching the second conductive layer may be a CMP process, an etch-back process, or a cleaning process.

Each of the lines 32 may include a barrier layer 30 formed on the inner surface of the line trench T and a metal layer 31 formed on the barrier layer 30. For example, the lines 32 may be formed by forming the barrier layer 30 on the entire structure after the process in which the line trenches T are formed, forming the metal layer 31 on the barrier layer 30 so that the line trenches T are fully filled, and then etching the metal layer 31 and the barrier layer 30 until the surface of the second interlayer insulating layer 28A is exposed.

The metal layer 31 may be made of material having lower resistance than the barrier layer 30. In this case, an electric current chiefly flows within the metal layers 31 of the lines 32. That is, a part formed of the metal layer 31 substantially functions as a line. For example, the barrier layer 30 may be made of any one of Ti, TiN, Ta, TaN, and TiSiN or a combination of them, and the metal layer 31 may be made of copper (Cu) or tungsten (W).

The regions where the line trenches T overlap with the contact holes H, that is, the openings of the etch stop layer 24 and the etched regions of the contact plugs 27A, from the line trenches T, are fully filled with the respective barrier layers 30, and the central regions of the line trenches T are filled with the respective metal layers 31 depending on the thickness of the metal layer 30. In other words, regions corresponding to the respective openings of the etch stop layer 24, from the line trenches T, and regions where the contact plugs are not formed, from the contact holes H1 and H2, are fully filled with the barrier layers 31.

In this case, most of the electric current flows through the metal layers 31 formed over the etch stop layer 24. Accordingly, the metal layers 31 formed over the etch stop layer 24 substantially function as lines.

The contact plugs and the lines are formed as described above. Then an insulating layer, such as an oxide layer, is formed between adjacent lines. An air gap may be formed by removing the insulating layer between adjacent lines. A process of forming the air gaps is described below with reference to FIG. 2F.

After forming the contact plugs and the lines, a process of removing the second interlayer insulating layer 28A formed between adjacent lines 32 may be performed. As a result, a gap region is formed between the adjacent lines 32. An insulating layer 33 is formed to cover the tops of the gap regions. Thus, an empty space, that is, an air gap 49, is formed between the adjacent lines 32.

It should be noted that the first interlayer insulating layer 23, under the second interlayer insulating layer 28A, is protected by the etch stop layer 24. Thus, only the second interlayer insulating layer 28A can be selectively removed while the first interlayer insulating layer 23 remains intact. Accordingly, the air gaps can be easily formed.

In accordance with the second embodiment of the invention, since the lines 32 are formed over the etch stop layer 24, the etch stop layer 24 having a relatively high dielectric constant is not disposed between the adjacent lines 32, but the second interlayer insulating layer 28A having a relatively low dielectric constant is disposed between the adjacent lines 32. Accordingly, capacitance between the adjacent lines 32 can be reduced, and capacitance between the lines 32 can be further reduced by the formation of the air gap.

FIGS. 3A to 3E are cross-sectional views illustrating contact plugs and lines formed according to a third embodiment of the invention. In describing this third embodiment, structures and processes similar to those described previously in conjunction with the descriptions of the first and second embodiments will not be described here, for the sake of brevity.

Figure 3A:
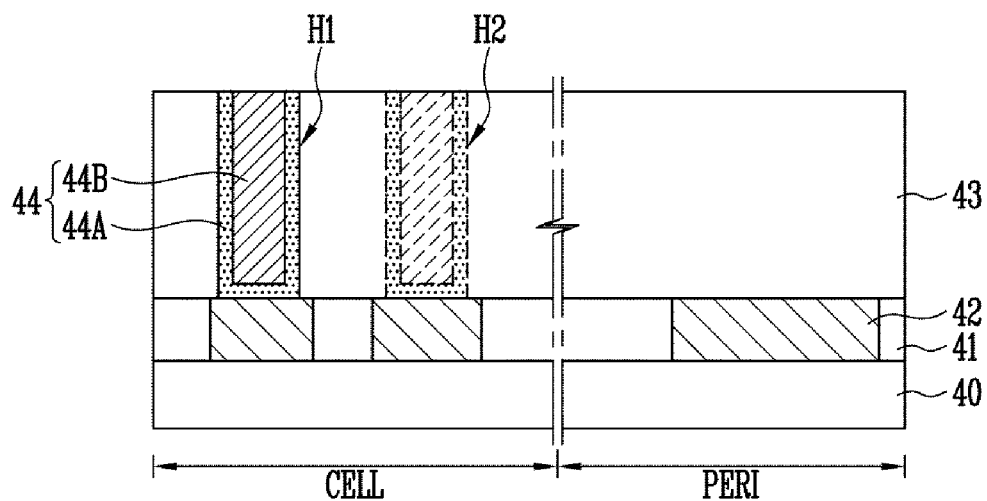

FIG. 3A shows that a first interlayer insulating layer 43 is formed over a substrate 40 upon which underlying structures 42 are formed. The underlying structures 42 may include lower lines and contact plugs which are formed within an interlayer insulating layer 41.

A plurality of contact holes (for example, H1 and H2) is formed in a cell region by etching the first interlayer insulating layer 43. A plurality of contact plugs 44 is formed within the respective contact holes H1 and H2 by filling the contact holes H1 and H2 with a first conductive layer. In this case, a top surface of the contact plugs 44 has the same height as that of the first interlayer insulating layer 43. Each of the contact plugs 44 may include a barrier layer 44A formed on the inner surface of the contact hole H and a metal layer 44B formed on the barrier layer 44A.

Figure 3B:
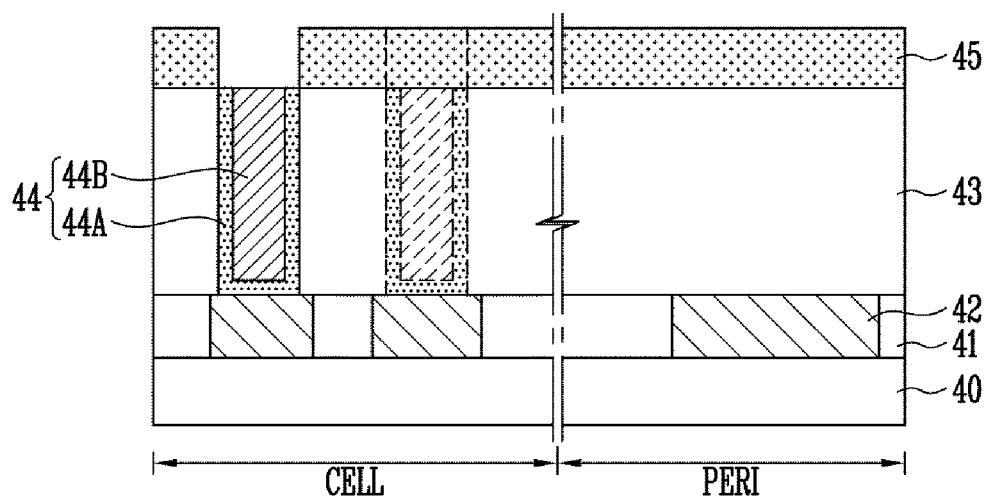

As shown in FIG. 3B, an etch stop layer 45 is formed on the first interlayer insulating layer 43 in which the contact plugs 44 are formed. The etch stop layer 45 is patterned. Here, the contact plugs 44 are exposed through the respective openings of the patterned etch stop layer 45. Thus, the contact holes H1 and H2 are extended through the etch stop layer 45.

If the etch stop layer 45 is formed after forming the contact plugs 44 as described above, a top surface of the contact plugs 44 becomes lower than a top surface of the etch stop layer 45. Although not shown, the contact plugs 44 may be partially etched to a specific depth so that the top surface of the contact plugs 44 becomes lower than the top surface of the first interlayer insulating layer 43.

A second interlayer insulating layer 46 is formed on the etch stop layer 45, as illustrated in FIG. 3C. A mask pattern (not shown) for lines is formed on the second interlayer insulating layer 46. Line trenches T through which the contact plugs 44 are exposed are formed by etching the second interlayer insulating layer 46 using the mask pattern for lines as an etch barrier.

As shown in FIG. 3D, second conductive layers are formed within the respective trenches T, thereby forming lines 47 coupled to the contact plugs 44. Each of the lines 47 may include a barrier layer 47A formed on the inner surface of the trench T and a metal layer 47B formed on the barrier layer 47A.

Here, regions corresponding to the openings of the etch stop layer 45 and the contact holes, from the line trenches T, may be fully filled with the respective barrier layers 47A, and the central regions of the line trenches T may be filled with the respective metal layers 47B depending on the thickness of the metal layer 30.

Figure 3E:
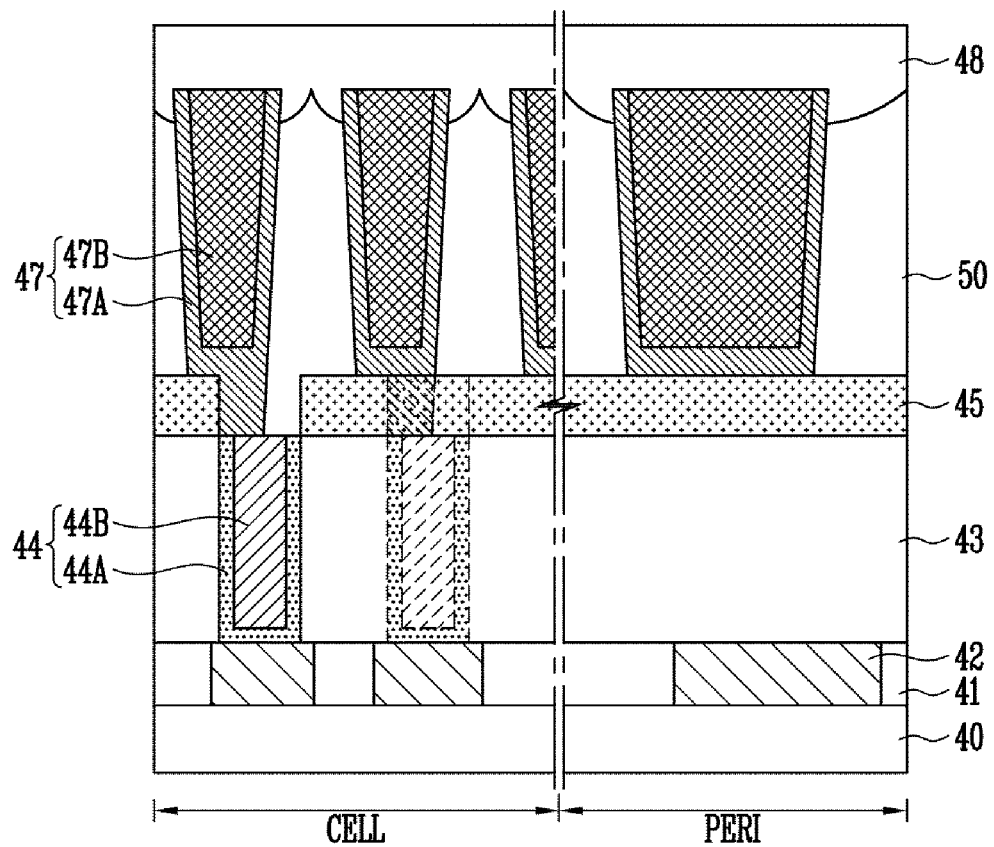

As shown in FIG. 3E, a gap region is formed between the lines 47 adjacent to each other by removing the second interlayer insulating layer 46 between the adjacent lines 47. An insulating layer 48 is formed to cover a top surface of the gap regions, thereby forming air gaps 50.

Figure 4A:
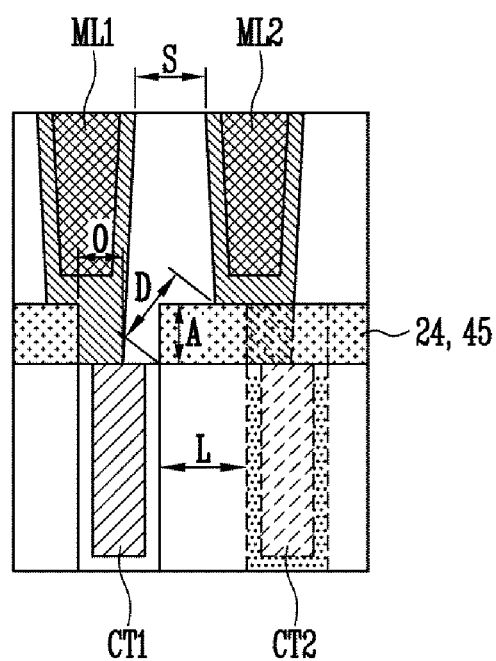
FIGS. 4A and 4B are cross-sectional views of semiconductor devices according to the second and third embodiments of the invention.
Figure 4B:
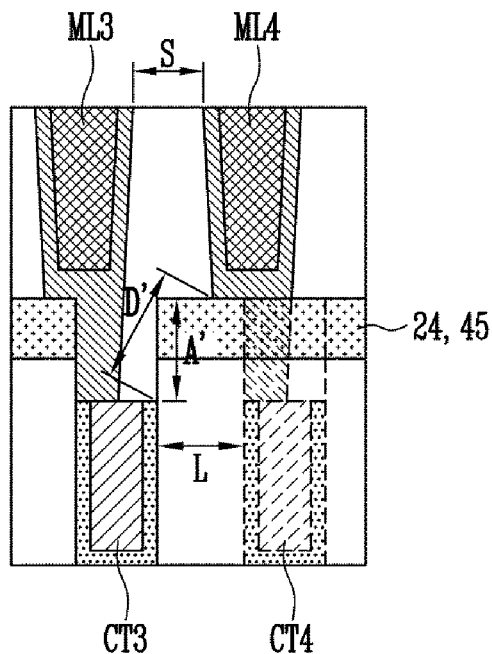

It should be noted that the top surface of the contact plugs 44 may become lower than the top surface of the etch stop layer 45 without a process of etching the contact plugs. FIGS. 4A and 4B are cross-sectional views of semiconductor devices according to the second and third embodiments of the invention. Effects due to a difference between the height of a top surface of the contact plugs and the height of a top surface of the etch stop layer are described below.

In FIGS. 4A and 4B, A indicates a difference between the height of a top surface of contact plugs CT1 and CT2 and the height of a top surface of an etch stop layer 24, 45. D indicates a distance between the contact plug CT1 and a line ML2 adjacent to the contact plug CT1. S indicates a distance between the adjacent lines ML1 and ML2 and a distance between the adjacent lines ML3 and ML4. O indicates a misalignment value between each of the lines ML1 and ML2 and each of the contact plugs CT1 and CT2 and a misalignment value between each of the lines ML3 and ML4 and each of the contact plugs CT3 and CT4. L indicates a distance between the adjacent contact plugs CT1 and CT2 and a distance between the adjacent contact plugs CT3 and CT4. Furthermore, A' indicates a difference between the height of a top surface of the contact plugs CT3 and CT4 and the height of the top surface of the etch stop layer 24, 45. D' indicates a distance between the contact plug CT3 and a line ML4 adjacent to the contact plug CT3.

When the difference between the height of the top surface of the contact plug CT1 and the height of the top surface of the etch stop layer 24, 45 is A as shown in FIG. 4A, Equation 1 below is satisfied:

$$D^2 = A^2 + (L-O)^2 \quad \text{[Equation 1]}$$

(where D>k)

Each of the distances S and L is determined to be equal to or greater than a critical distance that does not generate a leakage current. The misalignment value O is determined by the lithography resolution and process conditions. To this end, the difference A is calculated so that the distance D between the contact plug CT1 and the adjacent line ML2 is equal to or greater than the critical distance k and the condition of Equation 1 is satisfied. For example, if the distance S between the adjacent lines ML1 and ML2 is determined to be equal to the critical distance k, the difference A that satisfies a condition D>S is calculated.

As shown in FIG. 4B, if a difference between the height of the top surface of the contact plugs CT3 and CT4 and the height of the top surface of the etch stop layer 24, 45 is A', Equation 2 below is satisfied:

$$D'^2 = A'^2 + (L-O)^2 \quad \text{[Equation 2]}$$

(where D'>k)

From the above equations, it can be seen that as the difference between the height of the top surface of the contact plug (for example, CT1) and the height of the top surface of the etch stop layer 24, 45 increases (that is, A<A'), the distance between the contact plug CT1 and the adjacent line ML2 may be increased (that is, D<D').

In accordance with the second and third embodiments of the invention, the difference A between the height of the top surface of the contact plug 27A, 44 and the height of the top surface of the etch stop layer 24, 45 may be controlled so that the distance between the contact plug 27A, 44 and a line adjacent to the contact plug 27A, 44 becomes the critical distance k or greater.

Figure 5A:
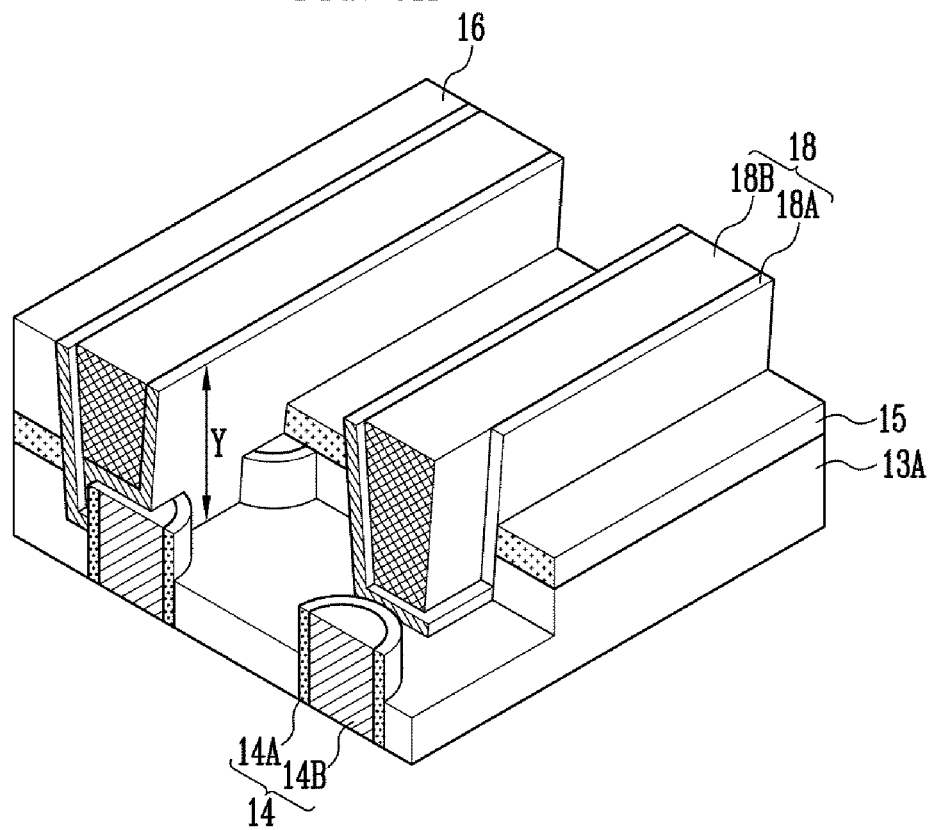
FIGS. 5A and 5B are perspective views of semiconductor devices according to the first through third embodiments of the invention.
Figure 5B:
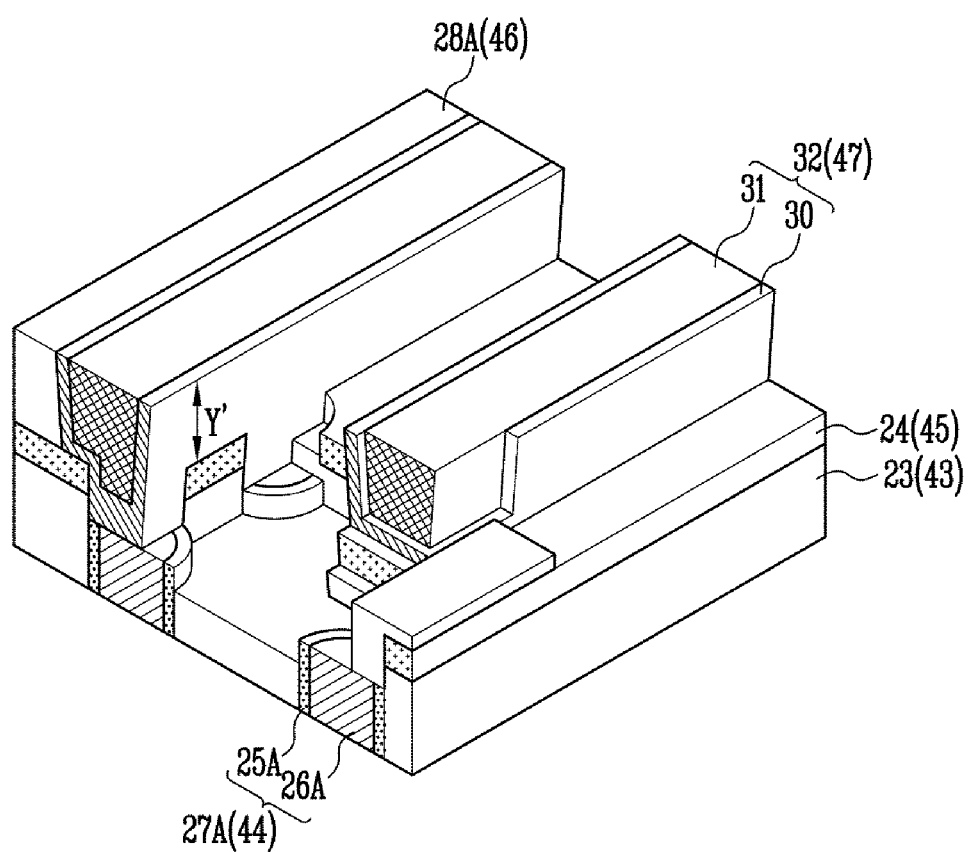

FIGS. 5A and 5B are perspective views of semiconductor devices according to the first through third embodiments of the invention. In particular, FIG. 5A shows a semiconductor device according to the first embodiment, and FIG. 5B shows a semiconductor device according to the second and third embodiments.

FIG. 5A illustrates, in accordance with the first embodiment of the invention, that the line trenches T are formed by etching the second interlayer insulating layer 16, the etch stop layer 15, and the first interlayer insulating layer 13 as described previously. Thus, the lines 18 are formed to penetrate the first interlayer insulating layer 13A, the etch stop layer 15, and the second interlayer insulating layer 16. Accordingly, the lines 18 adjacent to each other are disposed to face each other spaced apart by a distance Y, and the etch stop layer 15, with a relatively high dielectric constant, is placed between the adjacent lines 18.

As shown in FIG. 5B, in accordance with the second and third embodiments of the invention, the line trenches T are formed by etching the second interlayer insulating layer 28, 46 (not shown) as described previously. Thus, the lines 32, 47 (not shown) are disposed over the etch stop layer 24, 45 and are formed to penetrate the second interlayer insulating layer 28, 46 (not shown). Accordingly, the lines 32, 47 adjacent to each other are disposed to face each other spaced apart by a distance Y', and only the second interlayer insulating layer 28A, 46, with a relatively low dielectric constant, is disposed between the adjacent lines 32, 47.

Accordingly, the line 32, 47, according to the second and third embodiments of the invention, has a lower capacitance value than the line 18 formed according to the first embodiment.

It should be noted that, in one or more embodiments in accordance with the present invention, air gaps may be formed by removing the second interlayer insulating layers 16, 28A between the adjacent lines 18, 32, 47.

In accordance with the first embodiment, an air gap 35 is formed by removing only part of the insulating layer placed between the lines 18 adjacent to each other, that is, the second interlayer insulating layer 16, as illustrated in FIG. 1E. Accordingly, the first interlayer insulating layer 13A and the etch stop layer 15 remain between the adjacent lines 18. In accordance with the second and the third embodiments, an air gap (49 in FIGS. 2F and 50 in FIG. 3E) is formed by fully removing the insulating layer placed between the lines 32, 47 adjacent to each other, that is, the second interlayer insulating layer 28A, 46. Accordingly, the air gap 49, 50 is formed in the entire region between the adjacent lines 32, 47.

Due to the above-described process, the line 32 according to the second and third embodiments in accordance with the present invention has a lower capacitance value than the line 18 according to the first embodiment.

Figure 6:
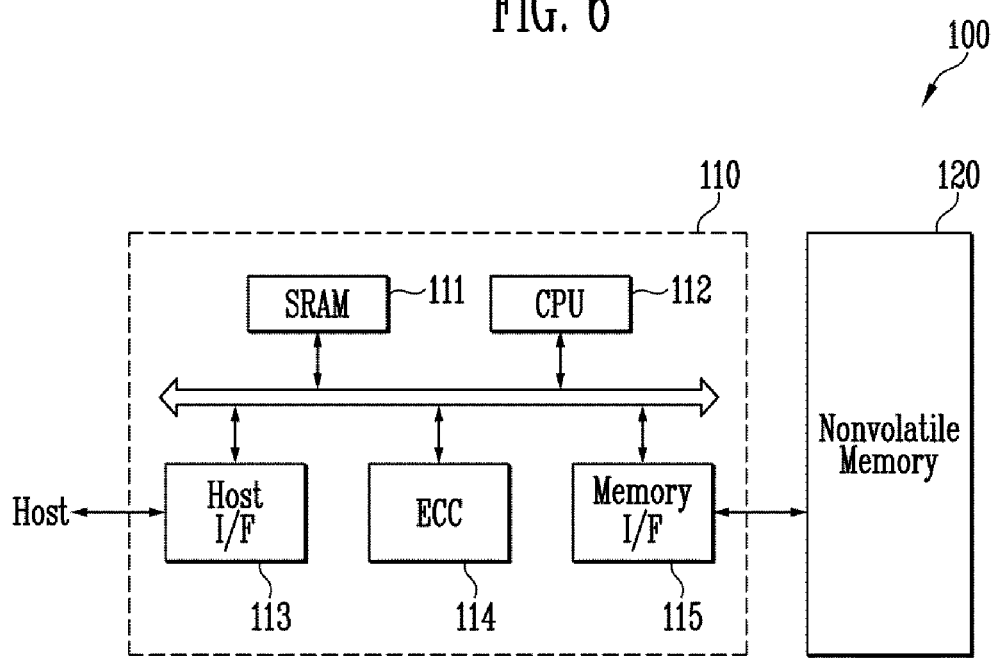
FIG. 6 is a block diagram of a memory system according to an embodiment of the invention.

As shown in FIG. 6, a memory system 100 in accordance with an embodiment includes a nonvolatile memory device 120 and a memory controller 110. The nonvolatile memory device 120 includes the above-described contact plugs and lines. In some embodiments, the non-volatile memory device 120 may be a multi-chip package including a plurality of flash memory chips.

The memory controller 110 is configured to control the nonvolatile memory device 120, and it may include SRAM 111, a central processing unit (CPU) 112, a host interface (I/F) 113, an error correction code (ECC) circuit 114, and a memory interface (I/F) 115. The SRAM 111 is used as the operating memory of the CPU 112. The CPU 112 performs an overall control operation for the data exchange of the memory controller 110. The host I/F 113 is equipped with the data exchange protocol of a host that accesses the memory system 100.

In addition, the ECC circuit 114 detects and corrects errors included in data read from the nonvolatile memory device 120. The memory I/F 115 provides an interface with the nonvolatile memory device 120. The memory controller 110 may further include RCM for storing code data for an interface with the host.

The memory system 100 configured as described above may be a memory card or a solid state disk (SSD) in which the nonvolatile memory device 120 and the controller 110 are combined. For example, if the memory system 100 is an SSD, the memory controller 110 may communicate with an external device (for example, a host) through one of various interface protocols, such as a USB, MMC, PCI-E, SATA, PATA, SCSI, ESDI, and IDE.

Figure 7:
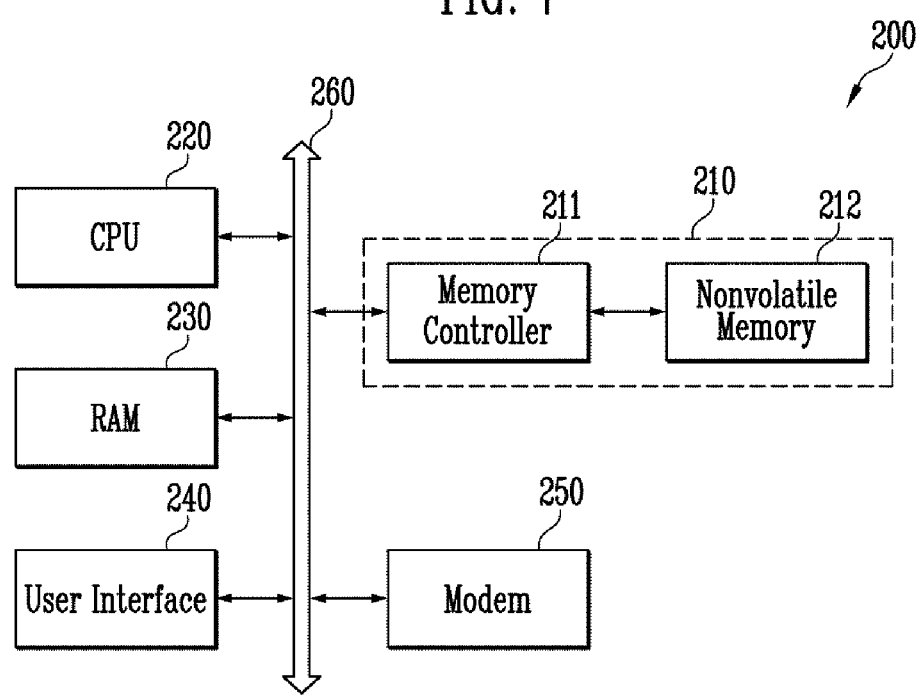
FIG. 7 is a block diagram of a computing system according to an embodiment of the invention.

FIG. 7 is a block diagram of a computing system in accordance with an embodiment of the invention. The computing system 200 may include a CPU 220, RAM 230, a user interface 240, a modem 250, and a memory system 210 all of which are electrically coupled to a system bus 260. If the computing system 200 is a mobile device, the computing system 200 may further include a battery for supplying operating voltages to the computing system 200. The computing system 200 may further include application chipsets, a camera image processor (CIS), mobile DRAM, and so on. The memory system 210 may include a non-volatile memory device 212 and a memory controller 211 as described above with reference to FIG. 6.

The present invention may be applied to processes for forming a variety of contact plugs and lines that are included in semiconductor devices. Examples of semiconductor devices to which the present invention may be applicable include, but are not limited to, volatile memory devices, non-volatile memory devices, flat panel type memory devices, and 3-D memory devices.

The semiconductor devices and methods described herein are directed, at least in part, toward preventing a leakage current between a contact plug and a line adjacent to the contact plug, and minimizing capacitance between adjacent lines. However, while certain embodiments have been described above, it will be understood to those skilled in the art that the embodiments described are by way of example only. Accordingly, the semiconductor device described herein should not be limited based on the described embodiments. Rather, the semiconductor device described herein should only be limited in light of the claims that follow when taken in conjunction with the above description and accompanying drawings.

What is claimed is:

1. A semiconductor device, comprising:
   a first interlayer insulating layer;
   an etch stop layer formed on the first interlayer insulating layer;
   contact holes formed to penetrate the etch stop layer and the first interlayer insulating layer;
   contact plugs formed in the respective contact holes and configured to have a top surface lower than a top surface of the etch stop layer;
   a second interlayer insulating layer formed over the contact plugs and the etch stop layer;
   line trenches formed to penetrate the second interlayer insulating layer, wherein the respective contact plugs are exposed in the line trenches; and
   lines formed in the trenches and coupled to the respective contact plugs,
   wherein a difference A between a height of the top surface of the contact plugs and the height of the top surface of the etch stop layer is determined on condition that a distance D between the contact plug and the lines adjacent to each other is a critical distance k or higher, wherein the critical distance k is a distance that does not generate a leakage current between the contact plug and the lines adjacent to each other.

2. The semiconductor device of claim 1, wherein the top surface of the contact plugs is lower than a top surface of the first interlayer insulating layer.

3. The semiconductor device of claim 1, wherein the etch stop layer and the second interlayer insulating layer have a relatively high degree of etch selectivity.

4. The semiconductor device of claim 1, further comprising an air gap formed between the lines adjacent to each other.

5. The semiconductor device of claim 1, wherein each of the lines comprises:
   a barrier layer formed on an inner surface of the trench; and
   a metal layer formed on the barrier layer.

6. The semiconductor device of claim 1, wherein the difference A between the height of the top surface of the contact plugs and the height of the top surface of the etch stop layer is determined to satisfy the equation:

$$D^2 = A^2 + (L-O)^2$$

wherein D>k, L is a distance between the contact plugs adjacent to each other, and O is a misalignment value between the line and the contact plug.

7. A semiconductor device comprising:
   a first interlayer insulating layer;
   an etch stop layer formed on the first interlayer insulating layer;
   contact holes formed to penetrate the etch stop layer and the first interlayer insulating layer;
   contact plugs formed in the respective contact holes and configured to have a top surface lower than a top surface of the etch stop layer;
   a second interlayer insulating layer formed over the contact plugs and the etch stop layer;
   line trenches formed to penetrate the second interlayer insulating layer, wherein the respective contact plugs are exposed in the line trenches; and lines formed in the trenches and coupled to the respective contact plugs, wherein each of the lines includes a barrier layer formed on an inner surface of the trench and a metal layer formed on the barrier layer, and regions corresponding to openings of the etch stop layer, from the trenches are fully filled with the barrier layer.

8. The semiconductor device of claim 7, wherein a difference A between a height of the top surface of the contact plugs and the height of the top surface of the etch stop layer is determined on condition that a distance D between the contact plug and the lines adjacent to each other is a critical distance k or higher, wherein the critical distance k is a distance that does not generate a leakage current between the contact plug and the lines adjacent to each other.

9. The semiconductor device of claim 8, wherein the difference A between the height of the top surface of the contact plugs and the height of the top surface of the etch stop layer is determined to satisfy the equation:

$$D^2 = A^2 + (L-O)^2$$

wherein $D > k$, L is a distance between the contact plugs adjacent to each other, and O is a misalignment value between the line and the contact plug.

\* \* \* \* \*